Feb. 26, 1957 H. BODE 2,783,382

FREQUENCY DIVIDER CIRCUIT FOR MUSICAL INSTRUMENTS

Filed July 6, 1954

Harald Bode, Inventor

United States Patent Office 2,783,382
Patented Feb. 26, 1957

2,783,382

FREQUENCY DIVIDER CIRCUIT FOR MUSICAL INSTRUMENTS

Harald Bode, Brattleboro, Vt., assignor, by mesne assignments, to Estey Organ Corporation (Del.), New York, N. Y., a corporation of Delaware Application July 6, 1954, Serial No. 441,253
13 Claims. (Cl. 250—36)

Figure 1:
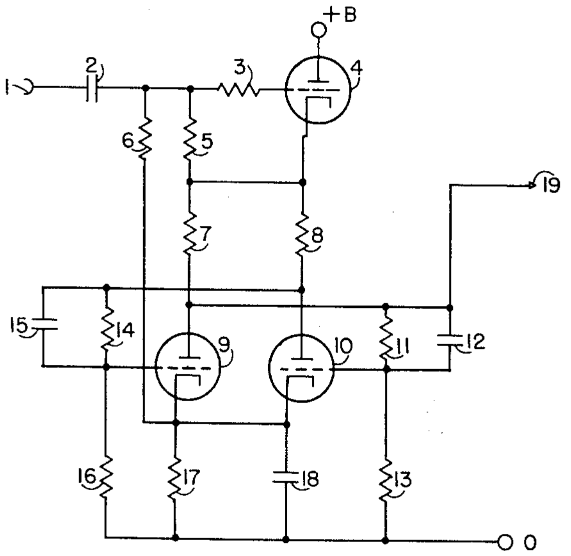

This invention relates to tone generating apparatus for an electronic musical instrument.

It is an object of the invention to provide in combination with a variable frequency oscillator and a frequency divider, a coupling network to impress the oscillator signals on the frequency divider and thereby synchronize the latter with the former.

It is a further object of the invention to minimize the loading effect of the frequency divider on the oscillator so that the operative condition of the former will not be reflected in the tone generated by the latter, as for example by a change in pitch.

In an electronic musical instrument it is common to make use of an electronic flip-flop (for example the so-called Eccles-Jordan circuit), for effectively dividing the frequency of a master oscillator whose frequency is manually variable. However conventional apparatus of this type is only reliable over a limited frequency range (for example one or two octaves) and also requires close component tolerances. In an electronic flip-flop of the type aforementioned, there are usually provided relatively small plate load resistors (for example 20,000 ohms) for the two triode electron discharge devices associated with the flip-flop, and these are connected to the plate voltage source through a common resistor of, for example, 10,000 ohms. It is usually at the junction of these three resistors, that a negative pulse or pulse series required for triggering the circuit is applied through a coupling capacitor. If this capacitor has a small value, for example, in the neighborhood of 10 mmfd., in order that the circuit present a negligible load on the oscillator, then relatively sharp pulses of short duration will be required to obtain reliable synchronization. But pulses of this kind are not generally available from a tone generator or oscillator suitable for an electronic musical instrument. For this reason, a larger coupling capacitor is necessary together with means to effectively greatly increase the impedance of the load of the frequency divider circuit as viewed by the oscillator. For this purpose, there are often employed preamplifier stages intermediate each stage including the master oscillator stage wherein output signals are derived from the respective plate circuits of the electron discharge devices associated with the preamplifiers. Hence, at least two such preamplifier stages will be required ordinarily between each pair of adjacent stages in order to furnish the requisite negative pulses to the frequency divider as are necessary for triggering it in response to the negative pulses generally provided at the output of each stage. According to my invention, however, it is proposed to replace the conventional resistor between the positive plate voltage supply terminal and the junction of the plate load resistors associated with the Eccles-Jordan type frequency divider with a cathode follower whose input or grid control circuit has impressed thereacross the synchronizing signals from the preceding stage.

Figure 2:
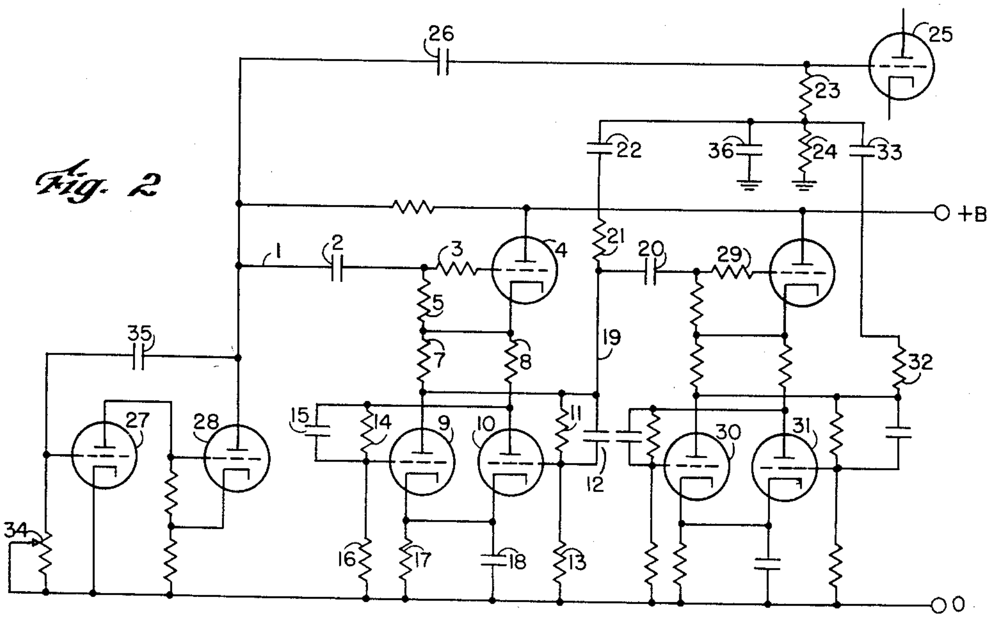

The novel features of the invention, together with further objects and advantages thereof, will become more readily apparent when considered in connection with the accompanying drawing in which:

Fig. 1 is a schematic diagram of combined coupling and frequency dividing apparatus according to the invention; and Fig. 2 is a schematic diagram of a variable frequency oscillator in addition to the apparatus of Fig. 1, also in accordance with the invention.

Referring now to the drawing, and more particularly to Fig. 1, it will be recognized by those skilled in the art that triode electron discharge devices 9 and 10 and their associated circuitry comprise an Eccles-Jordan type frequency divider or flip-flop. In order to trigger such a frequency divider, it is conventional to decrease in some way the anode current flowing in the conductive one of the triode electron discharge devices 9 and 10 thereby to effectively transfer the current to the other one of the triodes. To this end, in accordance with the invention, there is provided coupling apparatus between a terminal 1 and the anode circuits of the triodes 9 and 10, the latter including anode resistors 7 and 8, respectively. More specifically, this coupling apparatus comprises a triode electron discharge device 4, together with associated circuitry to form a cathode follower having an input circuit or control circuit coupled between the terminal 1 and ground, and an output circuit or cathode circuit coupled to the anode circuits of the triodes 9 and 10 associated with the frequency divider. In the input circuit of the cathode follower is a capacitor 2 connected between terminal 1 and the control electrode or grid of triode 4, and a resistor 5 coupled between capacitor 2 and the cathode of triode 4. In the preferred embodiment of Fig. 1, it has also been found desirable to employ an additional resistor 3 connected between capacitor 2 and the grid of triode 4, as well as a resistor 6 connected from the junction of capacitor 2, and resistors 3 and 5 to the cathodes of triodes 9 and 10, although these are not essential. Resistor 6 in combination with resistor 5 serves as a voltage dividing circuit, in effect, to bias the grid of triode 4 slightly negatively with respect to the cathode.

In operation when a negative voltage or pulse is applied between terminal 1 and ground, which is represented by terminal 0, triode 4 has its anode current greatly decreased with the result that the anode voltages of triodes 9 and 10 are also greatly decreased. In this way, the current flowing in the anode circuit of the conductive one of triodes 9 and 10 will be likewise decreased, since the cathode (or anode) circuit of triode 4 is effectively in series with the anode circuits of triodes 9 and 10. The end result is that the frequency divider will be triggered in an incomparably more effective way than would be the case if conventional type coupling circuits are employed to transmit the triggering pulse. Also, as is well known, the cathode follower has a relatively high input impedance so that the load of the frequency divider, as viewed by an oscillator (not shown) supplying triggering pulses to terminal 1, will be of relatively high impedance. Accordingly, the operative condition of the frequency divider, even if it be completely deenergized for example, will not affect appreciably the operational characteristics of the oscillator, particularly as regards its tuning.

In the apparatus of Fig. 1, it has been found desirable to employ by-pass capacitors 12 and 15 for the frequency divider stage of relatively large value, for example, .05 mfd. With this slight modification of a conventional Eccles-Jordan type frequency divider, reliable synchronization with a master oscillator frequency which may vary over a range of six octaves or more has been obtained, with the frequency divided output appearing at 19. So far as I am aware, this result has not been achieved with any other apparatus.

Fig. 2 illustrates schematically coupling and frequency dividing apparatus similar to that shown in Fig. 1 in combination with a variable frequency oscillator including a pair of triode electron discharge devices 27 and 28, and a variable resistor 34 to control the frequency of the oscillator. Also two frequency divider stages like that of Fig. 1 have been illustrated, a portion of the output signal from the first stage being utilized to trigger, that is to synchronize the second stage. Additionally, there has been illustrated a mixing or control stage including a triode electron discharge device 25. Those skilled in the art will recognize the oscillator stage to be of a well-known type so that in view of the fact that it forms no part of the present invention suffice it to say that resistor 34 is adapted to be varied by manual means such as keys for the selection of the desired tones of fundamental frequency. In certain instruments such as melody instruments, however, it is desirable to complement each tone generated by the variable frequency or master oscillator with subharmonic tones, as are provided by the frequency divider stages. Accordingly, the signals generated by the master oscillator stage are impressed both on the first frequency divider stage through coupling capacitor 2 and on the control or mixing stage through a capacitor 26. The same is true of the first frequency divider stage in that the subharmonic signal generated thereby is applied not only to the second frequency divider stage for synchronizing the latter, but also through a coupling capacitor 20 and the series combination of a resistor 21 and a capacitor 22 to the mixing stage. Since in the embodiment of Fig. 2 only two frequency divider stages have been employed by way of illustration the output signal generated by the second of these is applied only to the mixing stage through a resistor 32 and capacitor 33 which are connected in series with one another. In the mixing or control stage, it will be observed that a voltage dividing arrangement is provided between the grid or control electrode of triode 25 and ground comprising resistors 23 and 24. As shown, the subharmonic signals are impressed only across resistor 24 whereas the fundamental tone signal generated by the master oscillator is impressed across the entire circuit, that is across the series combination of resistors 23 and 24. It will be apparent to those skilled in the art that this is to deemphasize somewhat the subharmonic signals as they appear in the final tone. If it is desired to reduce also the harmonic content of the subharmonic signals as compared with that of the fundamental signal, a bypass capacitor 36 may be connected in parallel with resistor 24 as shown. Ordinarily, various filtering means to further modify the waveform of the composite signals to obtain the most pleasing tonal qualities will also be provided, but since the choice of filter circuits is more or less optional and forms no part of the present invention, none have been illustrated. Those skilled in the art will recognize, nevertheless, that what has been illustrated and described in detail herein is susceptible of various modifications within the spirit and scope of the invention.

Therefore what is claimed is:

1. In an electronic musical instrument, a manually variable frequency oscillator to provide master signals representing fundamental musical tones; at least one Eccles-Jordan type frequency divider to provide subharmonic signals to complement the master signals and thereby enhance the quality of the tones; and coupling means to impress on said frequency divider for synchronizing same the master signals from said oscillator; said coupling means including a cathode follower having an input circuit coupled to said oscillator and an output circuit coupled to the anode circuits of said frequency divider to decrease periodically the amount of current in the conductive one of said anode circuits and thereby repetitively trigger said frequency divider.

2. In an electronic musical instrument, a manually variable frequency oscillator to provide master signals representing fundamental musical tones, said oscillator including an output circuit across which said master signals are developed; at least one Eccles-Jordan type frequency divider to provide subharmonic signals to complement the master signals and thereby enhance the quality of the tones; said frequency divider including a pair of electron discharge devices, each having an anode circuit and a control circuit; and coupling means to impress the master signals on said frequency divider for synchronizing the same, said coupling means including a cathode follower having an input circuit coupled to the output circuit of said oscillator, and an output circuit adapted to energize the respective anode circuits of said frequency divider in a manner whereby the anode potential thereof is decreased periodically in response to the master signals from said oscillator thereby repetitively triggering said frequency divider.

3. The combination according to claim 2 wherein said cathode follower includes an electron discharge device having an anode, a cathode and a control electrode; and means to provide an anode voltage between a positive terminal connected to said anode and a negative terminal connected to a common junction point or ground, the respective anode circuits of said frequency divider being connected between said cathode and ground.

4. The combination according to claim 3 wherein the input circuit of said cathode follower comprises a capacitor coupled to the control electrode of the electron discharge device associated with said cathode follower, and a resistor coupled between said control electrode and the cathode.

5. In an electronic musical instrument, a manually variable frequency oscillator to provide master signals representing fundamental musical tones, said oscillator including an output circuit across which said master signals are developed; at least one Eccles-Jordan type frequency divider to provide subharmonic signals to complement the master signals and thereby enhance the quality of the tones; said frequency divider including a pair of electron discharge devices, each having an anode circuit and a control circuit; and coupling means to impress the master signals on said frequency divider for synchronizing same, said coupling means comprising an electron discharge device having an anode, a cathode and a control electrode, a capacitive element and a first resistive element connected in series with one another between the output circuit of said oscillator and said control electrode, a second resistive element connected from the junction of said capacitive element and first resistive element to said cathode, and means to apply an anode voltage between said anode and a common junction point or ground, the anode circuits associated with said frequency divider being connected between said cathode and said common junction point.

6. The combination according to claim 5 including a third resistive element of substantially greater resistance than said second resistive element, said third resistive element having one of its ends maintained at a fixed potential very nearly the same as the potential of said common junction point or ground, and the other of its ends connected to the junction of said capacitive element and said first resistive element, thereby to provide a bias voltage for the electron discharge device associated with said cathode follower.

7. A frequency divider system for use following a master oscillator manually variable in frequency and having an output, in combination a frequency divider to provide subharmonic signals and having a pair of electron discharge devices each having an anode circuit; a cathode follower having atn imput circuit coupled to the output of said oscillator and an output circuit connected to energize the anode circuits of the frequency divider; and a source of anode voltage for said cathode follower.

8. The combination of claim 7 in which the cathode follower input circuit includes a grid and means to bias said grid slightly negative.

9. The combination of claim 8 in which a resistance is inserted between the said grid and said oscillator output circuit.

10. The combination of claim 7 in which the frequency divided alternating voltage is tapped from the anode circuit of one of the frequency divider devices for use by way of a series resistor and condenser.

11. A frequency divider system for use following a master oscillator manually variable in frequency and having an output, in combination, a plurality of frequency dividers to provide subharmonic signals and each having a pair of electron discharge devices each having an anode circuit; a cathode follower for each such divider and having an input circuit, means coupling the input circuit of one of said cathode followers to the output of said oscillator, an output circuit for each cathode follower connected to energize the anode circuits of its respective frequency divider, a source of anode voltage for all said cathode followers, each frequency divider having an output of divided alternating voltage tapped from the anode circuit of one of its discharge devices, means connecting the last mentioned output to the input circuit of the cathode follower of the next succeeding frequency divider, a mixing stage having an electron discharge device provided with an input circuit, circuits connecting the output of the master oscillator and the outputs of each frequency divider to the input circuit of said mixing stage and an output for said mixing stage.

12. The system defined in claim 11 in which the output of each frequency divider is delivered to the input circuit of the mixing stage through an individual series connected resistor and condenser.

13. The system of claim 12 in which one or more of the several frequency outputs is delivered to the input circuit of the mixer stage through the agency of a dual resistor voltage divider to control the relative amplitudes thereof.

No references cited.